(12) United States Patent
Hwang (10) Patent No.: US 7,952,203 B2
(45) Date of Patent: May 31, 2011

(54) METHODS OF FORMING C4 ROUND DIMPLE METAL STUD BUMPS FOR FINE PITCH PACKAGING APPLICATIONS AND STRUCTURES FORMED THEREBY

(75) Inventor: Chi-won Hwang, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 326 days.

(21) Appl. No.: 12/231,167

(22) Filed: Aug. 29, 2008

(65) Prior Publication Data

US 2010/0052159 A1    Mar. 4, 2010

(51) Int. Cl.
*H01L 23/485* (2006.01)
(52) U.S. Cl. .. 257/775; 257/779; 257/786; 257/E23.021
(58) Field of Classification Search .................. 257/775
See application file for complete search history.

(56) References Cited

U.S. PATENT DOCUMENTS

2006/0246626 A1* 11/2006 Jiang et al. .................... 438/114
2009/0206479 A1* 8/2009 Daubenspeck et al. ....... 257/738

* cited by examiner

*Primary Examiner* — Stephen W Smoot
(74) *Attorney, Agent, or Firm* — Kathy J. Ortiz (57) ABSTRACT

Methods of forming microelectronic device structures are described. Those methods may include forming a passivation layer on a substrate, wherein the substrate comprises an array of conductive structures, forming a first via in the passivation layer, forming a second via in the passivation layer that exposes at least one of the conductive structures in the array, and wherein the second via is formed within the first via space to form a step via, and forming a conductive material in the step via, wherein a round dimple is formed in the conductive material.

14 Claims, 10 Drawing Sheets

METHODS OF FORMING C4 ROUND DIMPLE METAL STUD BUMPS FOR FINE PITCH PACKAGING APPLICATIONS AND STRUCTURES FORMED THEREBY

BACKGROUND OF THE INVENTION

Microelectronic package design is moving towards increasingly finer lines to meet the demands of more functionality and higher speed. This trend has placed increasing demand on high density printed circuit boards (PCBs) and package substrates. For example, the ability to fabricate fine pitch solder interconnection for less than about 100 micron pitch has been one of the huge challenges in advanced 3D packaging technology. However, conventional solder deposition methods using stencil solder paste printing techniques, for example, typically cannot provide for such fine solder interconnection.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming microelectronic structures are described. Those methods may include forming a passivation layer on a substrate, wherein the substrate comprises an array of conductive structures, forming a first via in the passivation layer, forming a second via in the passivation layer that exposes at least one of the conductive structures in the array, and wherein the second via is formed within the first via space to form a step via, and forming a conductive material in the step via, wherein a round dimple is formed in the conductive material. Methods of the present invention enable the fabrication of fine line/space wiring for use in packaging applications, for example.

FIGS. 1a-1h illustrate embodiments of methods of forming microelectronic structures, such as methods for forming portions a package substrate, for example. The various embodiments enable methods to produce large dimple metal C4 stud bumps that increase solder deposition volume with improved uniformity on the dimple bumps. This approach can provide fine pitch solder interconnection solutions with improved joint reliability.

Figure 1A:
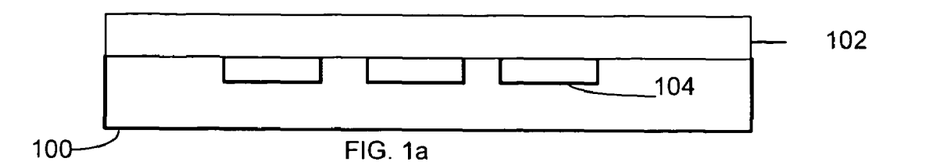
FIGS. 1a-1e represent structures according to an embodiment of the present invention.

In an embodiment, a semi-cured passivation layer 102 may be formed on a substrate 100 (FIG. 1a). The substrate 100 may include a portion of a package substrate 100, in some embodiments. The substrate 100 may comprise an array of conductive structure 104, which may comprise metallic layer conductive structures 104 such as but not limited to copper lines, for example, and may include such structures as a top metal array of conductive structures 104 and/or a metallic redistribution layer of an array of conductive structures 104 in a semiconductor die.

The semi-cured passivation layer 102 may comprise a polyimide type material coating, in an embodiment, that may be formed on the substrate by using a spin coater and then may be semi-cured in an oven, for example. Although the thickness of the semi-cured passivation layer 102 can be varied depending on the particular process parameters, such as a first step via depth as in FIG. 1b of the present invention) generally, it can range between about 4 microns to about 7 microns in thickness.

Figure 1B:
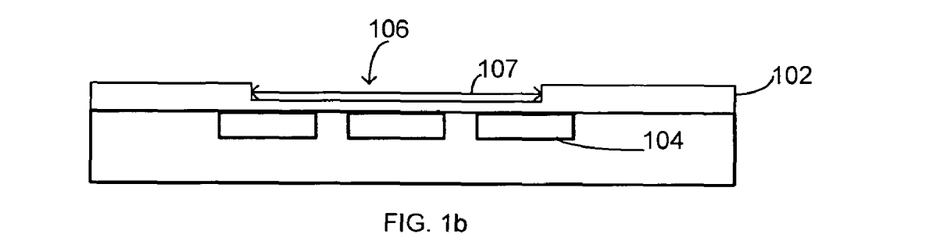
Figure 1C:
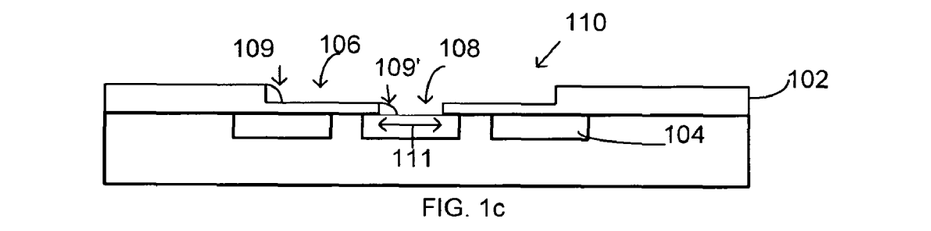

A first via (opening) 106 may be formed in the passivation layer 102 (FIG. 1b). Nano imprinting techniques can be used for the fabrication of the first via 106, or any other applicable technique, as are known in the art. The passivation layer 102 remains covering the array of conductive structures 104 after the formation of the first via 106. The passivation layer 102 may be further cured in some embodiments. The first via 106 may comprise a first width 107.

A second via (opening) 108 may be formed in the passivation layer 102 (FIG. 1c), and may be formed using laser ablation and/or lithography/etching techniques, for example. The width 107 of the first via 106 may be greater than a width 111 of the second via 108. In an embodiment, the second via 108 may be formed within the first via 106 to form a step via 110. The shape of first and second vias 106, 108 may comprise a one of a square and a rectangle shape in some embodiments, but may comprise other geometries according to the particular application. In an embodiment, the second via 108 may be formed such that the second via 108 connects to at least one of the conductive structures in the array of conductive structures 104. In an embodiment, the first via 106 and the second via 108 may comprise angles 109, 109' that may or may not be of the substantially magnitude. In one embodiment, the angles 109, 109' may comprise an angle of about 80 degrees to about 100 degrees, for example.

Figure 1D:
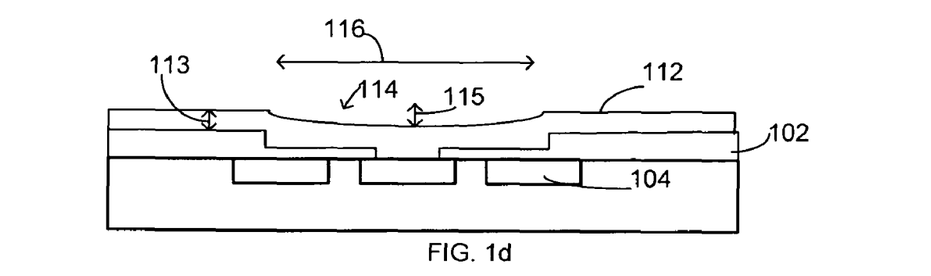

In an embodiment, a conductive material 112 may be formed in the step via 110 (FIG. 1d). The conductive material 112 may comprise any conductive material, such as but not limited to copper, for example. The conductive material 112 may comprise a round dimple 114 that may be formed in the conductive material 112. The round dimple 114 may comprise a diameter 116 that may extend across a portion of the conductive array 104, and may extend across the second via 108. The round dimple 114 may comprise a dishing in the conductive material 112, and may comprise a depth 115, whose magnitude and shape may vary according to the particular application.

In an embodiment, the conductive material 112 may be formed in the step via 110 by utilizing a copper seed layer followed by a copper plating process, for example. In an embodiment, a copper seed layer may be formed followed by an electroless Cu plating process. Subsequently, an electrolytic Cu plating process may be performed. A thickness 113 of the conductive material 112 may comprise under about 20 microns, and in some cases may comprise between about 4 microns to about 7 microns.

Figure 1E:
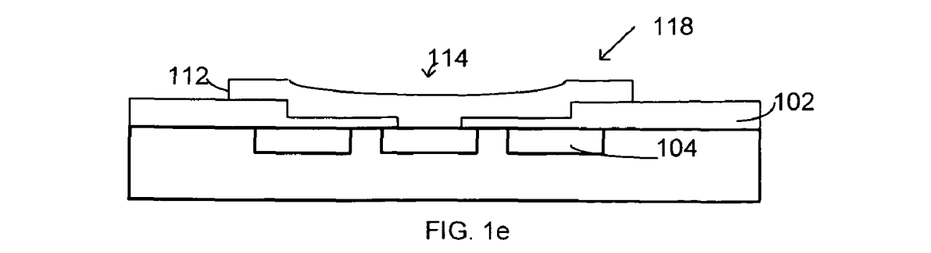

In an embodiment, the thickness of the conductive material 112 may be optimized to control the shape of the round dimple 114. Generally, it is possible to optimize the round dimple by controlling the step via size and the thickness 113 of the conductive material 112, according to the particular application. In an embodiment, the conductive material 112 comprising the round dimple 114 may be further patterned utilizing lithography/etching techniques according to the particular application (FIG. 1e). In an embodiment, the round dimple 114 and the conductive material 112 may comprise a portion of a round dimple conductive stud bump 118. Round and large dimple C4 metal stud bumps may be fabricated in this manner, wherein the passivation layer may be disposed between the C4 round dimple metal stud bump and a top metal layer in a package structure, for example. In an embodiment, the round dimple stud bump structure may extend over greater than one of the conductive structures in the array.

Figure 2A:
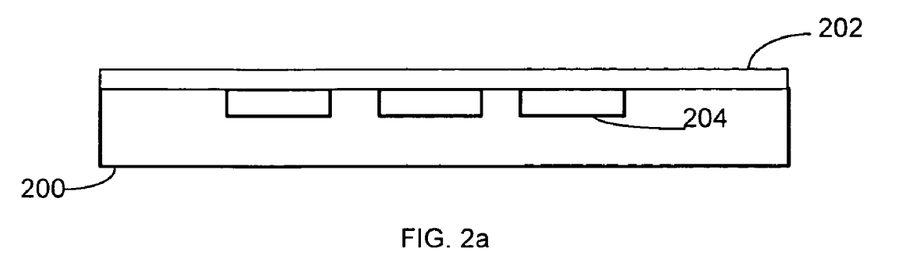
FIGS. 2a-2f represent structures according to an embodiment of the present invention.

In another embodiment, a cured passivation layer 202 may be formed on a substrate 200 (FIG. 2a). The substrate 200 may comprise an array of conductive structures 204, similar to substrate 100 of FIG. 1a. The cured passivation layer 202 can be formed from polyimide type materials, and may be coated and cured onto the substrate 200 by using conventional spin coater and cure oven techniques, as are known in the art. In an embodiment, a thickness of the cured passivation layer 202 may comprise between about 1 micron to about 3 microns.

Figure 2B:
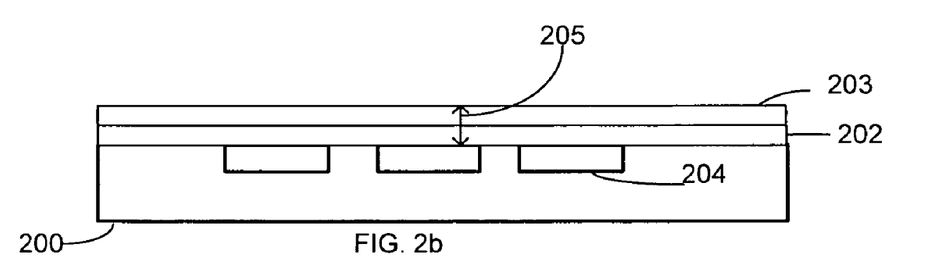

A semi-cured passivation layer 203 may be laminated on the cured passivation layer 202 (FIG. 2b), and may comprise polyimide type materials, in some embodiments. The semi-cured passivation layer 203 may be formed by coating and semi-curing techniques. In an embodiment, a total thickness 205 of the cured and semi-cured passivation layers 202, 203 may comprise between about 4 microns to about 7 microns.

Figure 2C:
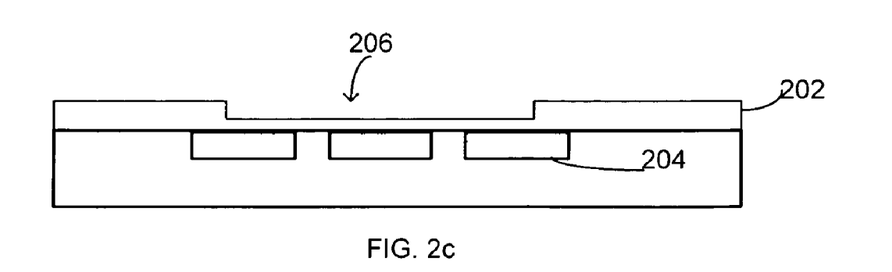

A first via (opening) 206 may be formed in the cured passivation layer 202 and in some embodiments, in a portion of the semi-cured passivation layer 203 (FIG. 2c), by using Nano imprinting techniques, for example. A portion of the semi-cured passivation layer 203 remains covering the array of conductive structures 204 after the formation of the first via 206. The passivation layers 202, 203 may be further cured in some embodiments.

Figure 2D:
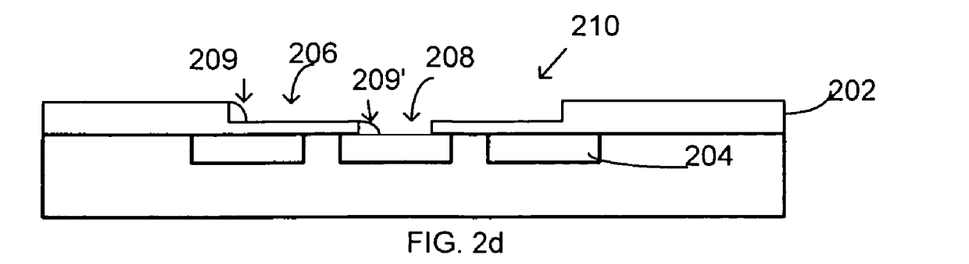

A second via (opening) 208 may be formed in the passivation layer 102 (FIG. 2d), and may be formed using laser ablation and/or lithography/etching techniques, for example. In an embodiment, the second via 208 may be formed within the first via 206 to form a step via 210, similar to the step via 110 in FIG. c, in some embodiments. In an embodiment, the second via 208 may be formed such that the second via 208 connects to at least one of the conductive structures in the array of conductive structures 204. In an embodiment, the first via 206 and the second via 208 may comprise angles 209, 209' that may or may not be of the substantially magnitude. In one embodiment, the angles 209, 209' may comprise an angle of about 80 degrees to about 100 degrees, for example.

Figure 2E:
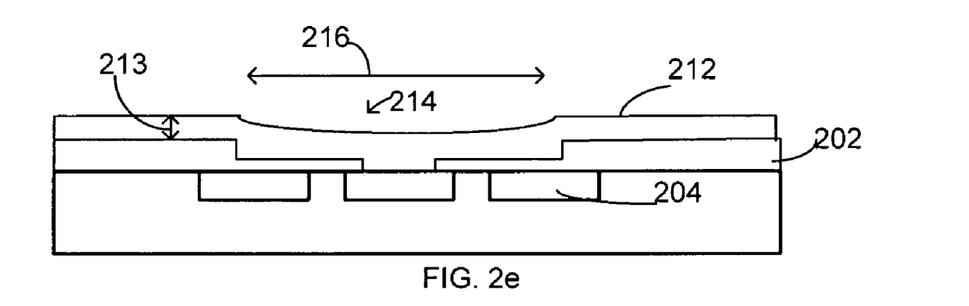

In an embodiment, a conductive material 212 may be formed in the step via 210 (FIG. 2e). The conductive material 212 may comprise a round dimple 214 that may be formed in the conductive material 212, similar to the round dimple 114 of FIG. 1d, for example. The round dimple 214 may comprise a diameter 216 that may extend across a portion of the conductive array 204, and may extend across the second via 208.

In an embodiment, the conductive material 212 may be formed in the step via 210 by utilizing a copper seed layer followed by a copper plating process, for example. In an embodiment, a copper seed layer may be formed in the step via 210 followed by an electroless copper plating process. Subsequently, an electrolytic copper plating process may be performed. A thickness 213 of the conductive material 212 may comprise under about 20 microns, and in some cases may comprise between about 4 microns to about 7 microns.

Figure 2F:
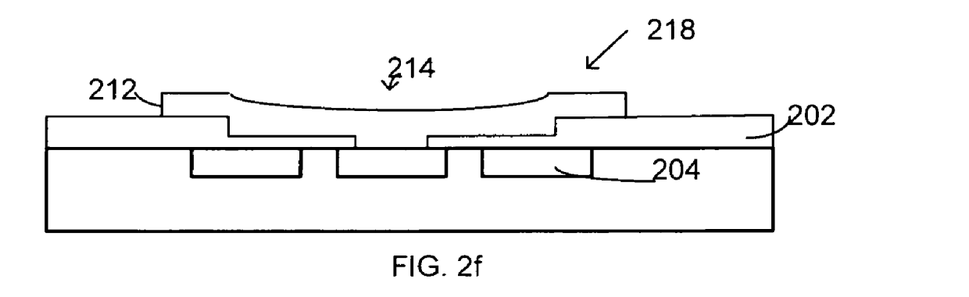

In an embodiment, the thickness of the conductive material 212 may be optimized to control the shape of the round dimple 214. In an embodiment, the round dimple 214 and the conductive material 212 may be further patterned utilizing lithography/etching techniques according to the particular application (FIG. 2f). In an embodiment, the conductive material 212 comprising the round dimple 214 may comprise a portion of a round dimple conductive stud bump 218. Round and large dimple C4 metal stud bumps may be fabricated in this manner.

Figure 3A:
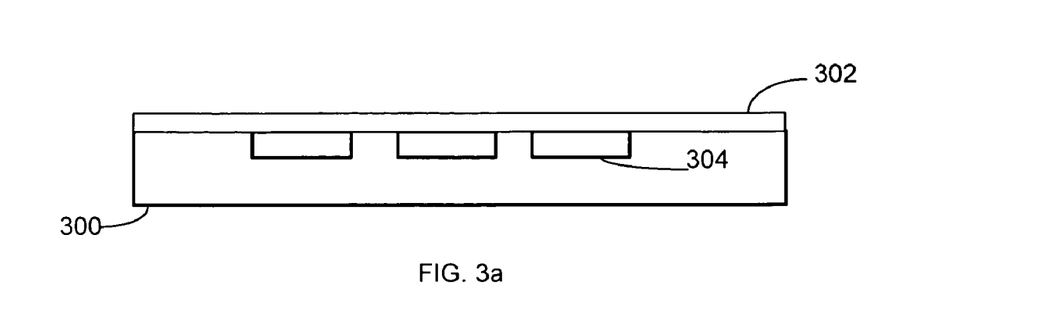
FIGS. 3a-3g represent structures according to an embodiment of the present invention.

In another embodiment, a cured passivation layer 302 may be formed on a substrate 300 (FIG. 3a). The substrate 300 may comprise an array of conductive structures 304, similar to substrate 100 of FIG. 1a. The cured passivation layer 302 can be formed from polyimide type materials, and may be coated and cured onto the substrate 300 by using conventional spin coater and cure oven techniques, as are known in the art. In an embodiment, a thickness of the cured passivation layer 302 may comprise between about 1 micron to about 3 microns.

Figure 3B:
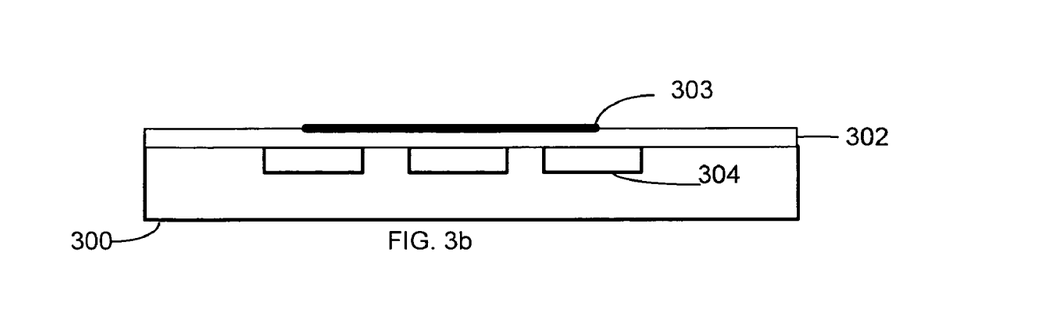

An etch stop layer 303 may be formed on the cured passivation layer 302. The etch stop layer 302 may comprise etch stop materials such as, but not limited to silicon nitride, for example. The etch stop layer 303 may be formed using deposition techniques such as but not limited to chemical vapor deposition (CVD) techniques, and may be formed on the areas where a first via may subsequently be fabricated in an embodiment (FIG. 3b).

Figure 3C:
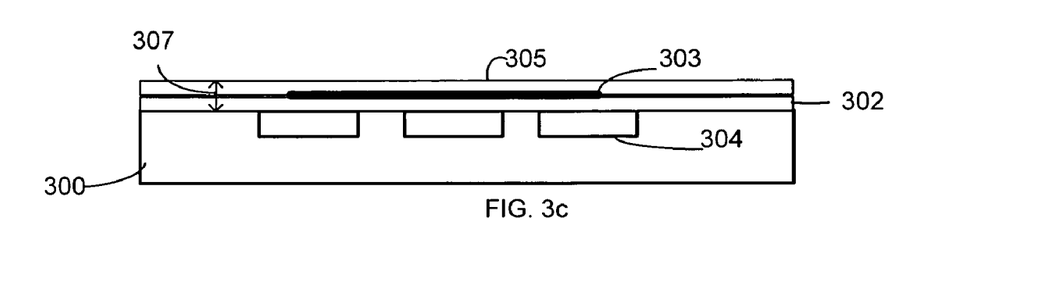

A second cured passivation layer 305 may be formed using polyimide type materials, and may be coated and cured using conventional spin coater and cure oven techniques, for example (FIG. 3c). Generally, the thickness of the second cured passivation layer 305 may comprise between about 1 micron to about 6 microns. A total thickness 307 of the passivation layers 302, 305 and the etch stop layer 303 may comprise about 4 microns to about 7 microns.

Figure 3D:
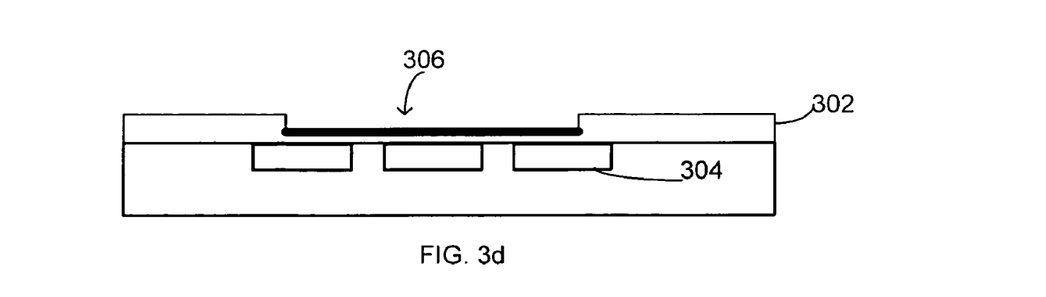

A first via (opening) 306 may be formed in the cured passivation layer 302 (FIG. 3d), by using laser ablation and/or lithography techniques, for example. A portion of the cured passivation layer 303 may remain covering the array of conductive structures 304 after the formation of the first via 306. In an embodiment, a portion of the cured passivation layer 302 may be removed above the etch stop layer 303, i.e., the etch stop layer 303 may act as an etch stop during the removal of the portion of the cured passivation layer 302. The passivation layers 302, 305 may be further cured in some embodiments.

Figure 3E:
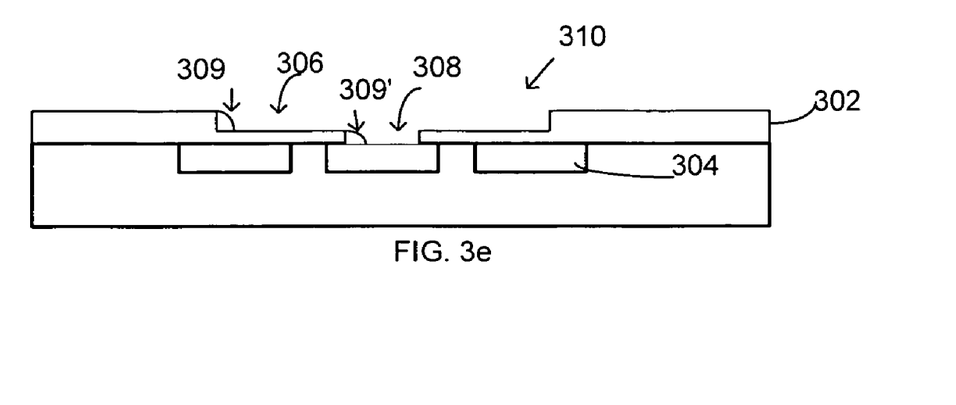

In an embodiment, the etch stop layer 303 can be removed by selective etchants, i.e., etchants that may remove the etch stop layer 303 and not the cured passivation layers 302, 305. In another embodiment, the etch stop layer 303 may remain in the substrate without removal. Laser ablation and/or lithography/etching techniques can be used for the fabrication of a second via 308 (FIG. 3e). In an embodiment, the second via 308 may be formed within the first via 306 to form a step via 310, similar to the step via 110 in FIG. 1c, in some embodiments.

In an embodiment, the second via 308 may be formed such that the second via 308 connects to at least one of the conductive structures in the array of conductive structures 304. In an embodiment, the first via 306 and the second via 308 may comprise angles 309, 309' that may or may not be of the substantially magnitude. In one embodiment, the angles 309, 309' may comprise an angle of about 80 degrees to about 100 degrees, for example.

Figure 3F:
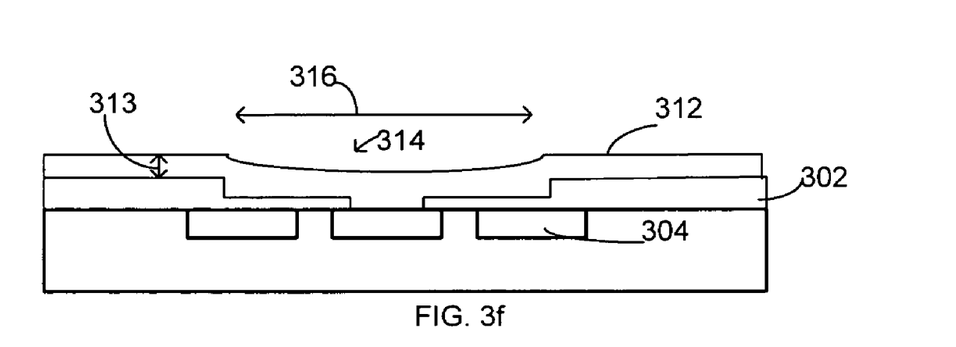

In an embodiment, a conductive material 312 may be formed in the step via 310 (FIG. 3f). The conductive material 312 may comprise a round dimple 314 that may be formed in the conductive material 312, similar to the round dimple 114 of FIG. 1d, for example. The round dimple 314 may comprise a diameter 316 that may extend across a portion of the conductive array 304, and may extend across the second via 308.

In an embodiment, the conductive material 312 may be formed in the step via 310 by utilizing a copper seed layer followed by a copper plating process, for example. In an embodiment, a copper seed layer may be formed in the step via 310 followed by an electroless copper plating process. Subsequently, an electrolytic copper plating process may be performed. A thickness 313 of the conductive material 312 may comprise under about 20 microns, and in some cases may comprise between about 4 microns to about 7 microns.

Figure 3G:
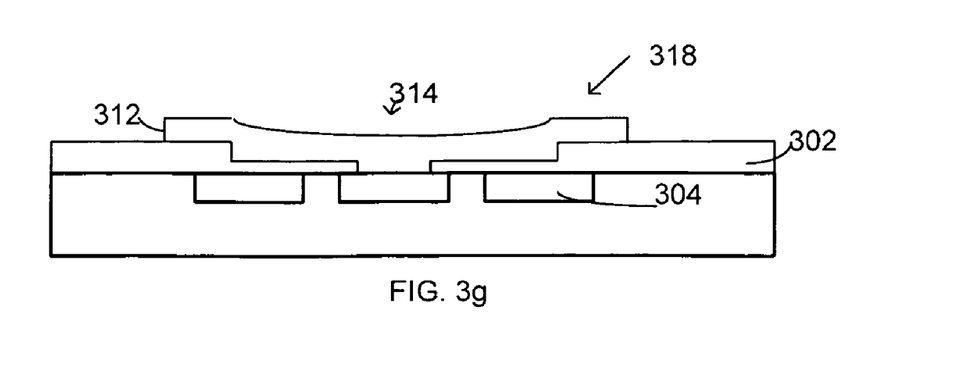
Figure 5A:
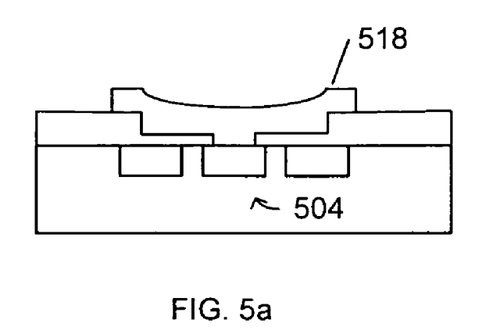
FIGS. 5a-5c represent structures according to embodiments of the present invention.
Figure 5B:
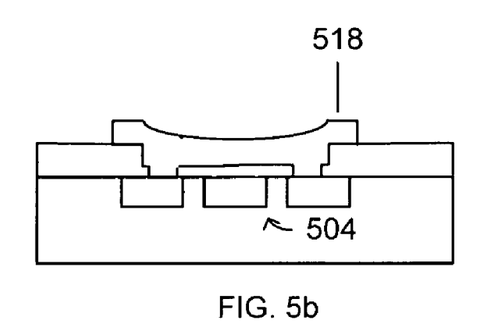
Figure 5C:
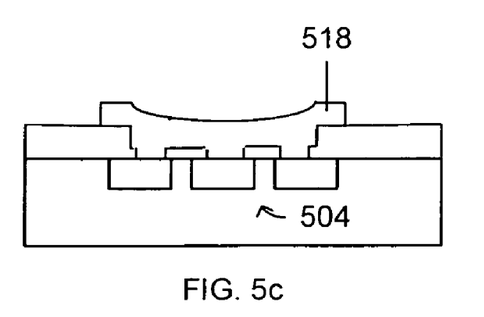

In an embodiment, the thickness of the conductive material 312 may be optimized to control the shape of the round dimple 314. In an embodiment, the conductive material 312 comprising the round dimple bump 314 may be further patterned utilizing lithography/etching techniques according to the particular application (FIG. 3g). In an embodiment, the conductive material 312 comprising the round dimple bump 314 may comprise a portion of a round dimple conductive stud bump 318. Round and large dimple C4 metal stud bumps may be fabricated in this manner. Referring to FIG. 5a-5c, in some embodiments, a round dimple metal stud bump 518 may connect one of the conductive structures of a conductive array (FIG. 5a) or it may connect to more than one of the conductive structures of a conductive array 104 (FIG. 5b-5c), depending upon the particular application.

Figure 4A:
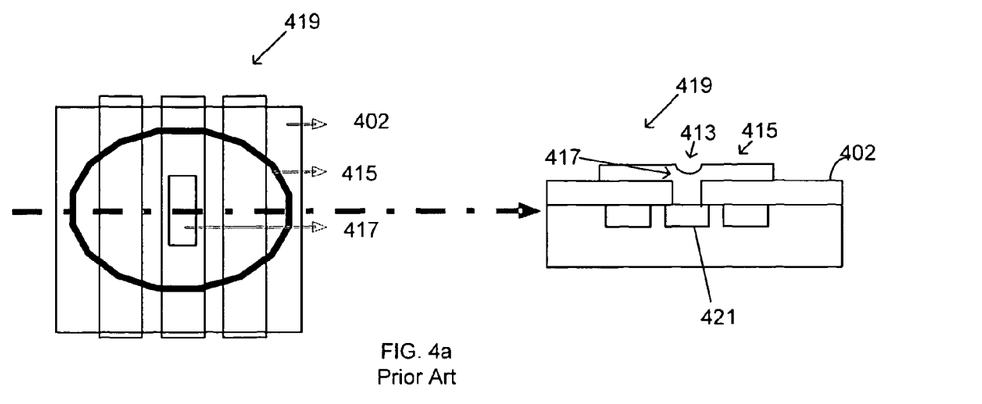
FIG. 4a represents structures according to the Prior Art.
Figure 4B:
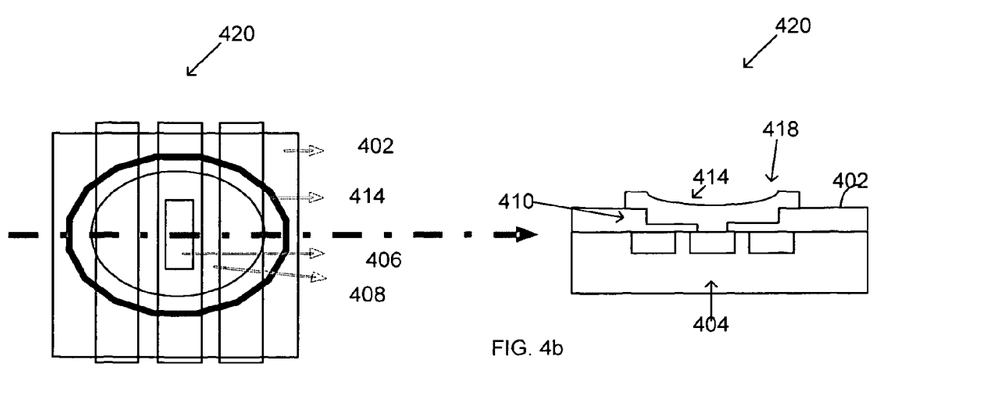
FIG. 4b represents structures according to an embodiment of the present invention.

Referring back to FIG. 4a, a top view and cross sectional view of a prior art straight via structure 419 is depicted, and may comprise a passivation layer 402, a metal stud bump 415 and a straight via 417. For example, the prior art via structure 419 may connect with the metal stud bump 415 to a power line 421 through the passivation layer 402. To contact the metal stud bump to only the power line 421, the width of the straight via 417 should be narrower than that of power line 421. Such a prior art straight via structure 419 typically allows for only a small dimple 413 in the middle of the stud bump 415. FIG. 4b depicts a step via structure 420 according to an embodiment of the present invention comprising a passivation layer 402, a round dimple metal stud bump 418, a first via 408 and a second via 408 that together comprise a step via 410.

The step via 410 enables the formation of a large and round dimple 414 that can allow for an increased volume of solder deposition and improved uniformity throughout subsequent solder bumping processing, such as during a self organization solder bumping process, for example. Thus, the step via 410 design is required to produce the large dimple 414 C4 metal stud bump 418 which can enable solder caps with increased solder deposition volume and with improved uniformity through self organization solder capping process, for example. In an embodiment, the large dimple 414 C4 metal stud bump 418 may extend over greater than one of the conductive structures of the conductive array 404.

Figure 6A:
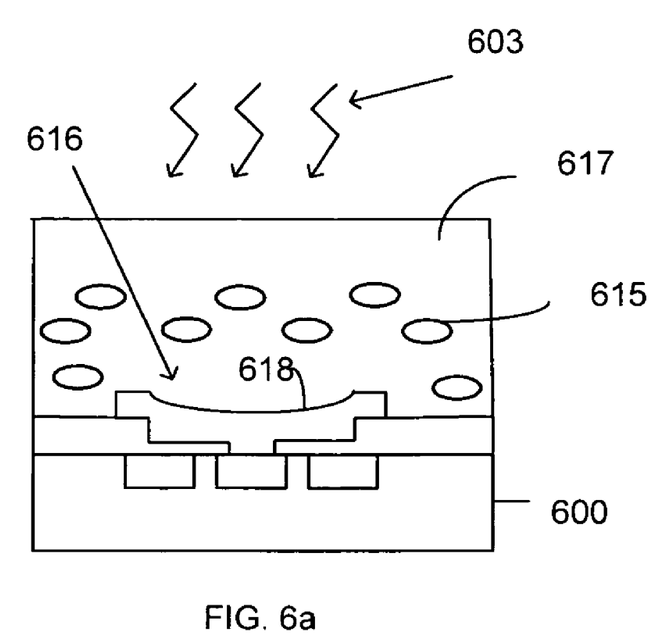
FIGS. 6a-6c represent structures according to embodiments of the present invention.
Figure 6B:
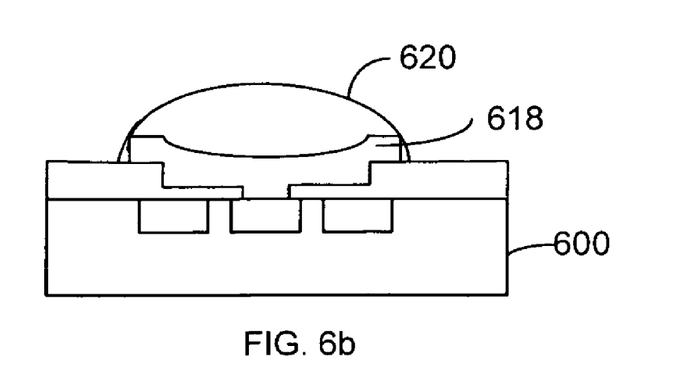

In another embodiment, a round dimple metal stud bump 618 may undergo a solder bumping processing 603, such as, but not limited to, a self organization solder capping process (FIG. 6a). A solder paste 617 may be dispensed over a top surface 616 of a bump side of substrate 600, wherein the substrate 600 may comprise a chip or wafer comprising a portion of a fine pitch 3D package, for example. During heating 619 (in a reflow oven, for example) solder particles 615 dispensed within the solder paste 617 may become molten, and may deposit/coalesce onto the round metal stud bump 618, and may further become coarsened to form a solder cap 620 on the round metal stud bump 618 (FIG. 6b).

Fine pitch solder interconnections of less than about 100 micron pitch have been one of the huge challenges in advanced 3D package technology. However, current conventional solder deposition methods using stencil solder paste printing cannot typically provide solder interconnection for such fine pitch devices without shorting between solder interconnections. Self organization solder capping techniques may provide cost effective and accurate solder composition control for binary or ternary lead-free solder alloys (e.g., Sn3.5Ag, Sn3Ag0.5Cu).

Figure 6C:
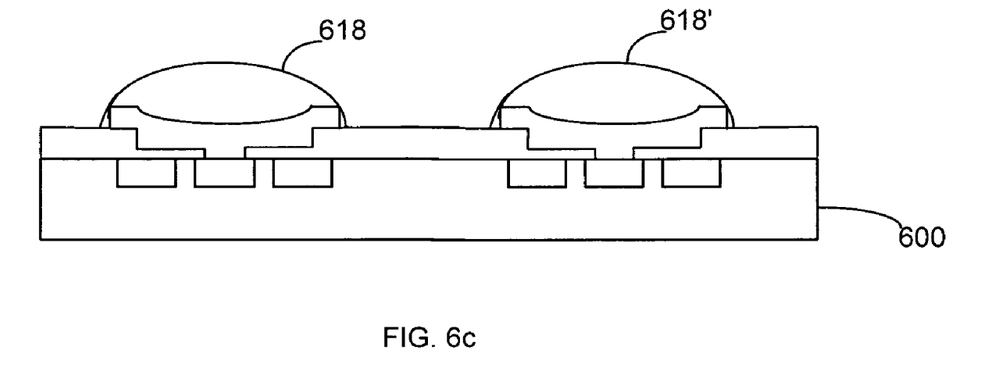

This is particularly advantageous when providing solder deposition on C4 metal stud bumps for fine pitch die to die stack applications, as compared to electrolytic plating solder bumping processes, for example. Such self organization solder capping techniques may provide reliable solder interconnections between adjacent stud bumps, such as the round metal stud bump 618 of the various embodiments of the present invention, which and are relatively free of shorting between solder interconnections (FIG. 6c).

Another advantage of the round metal stud bump 618 is that it provides an increase in solder deposition volume. It is known that a small solder cap (small volume of solder deposition) may contribute to solder wicking and/or joint failures. Thus the round metal stud bump 618 serves to improve joint reliability in devices utilizing the round metal stud bump 618 of the various embodiments of the present invention.

Some key factors that may be optimized to increase the solder deposition volume and its uniformity during the self organization solder capping process include solder paste materials design such as solder metal powder contents, solder metal powder size, activators, and additives. C4 metal bump design such as bump materials selection, height, shape of dimple, surface finish (or no finish) etc. Process control factors may include solder paste dispensing volume, temperature/time profile and atmosphere/pressure conditions.

In general, shorter solder cap heights combined with round and large dimple shape bump comprise greater uniformity of solder cap height. In some embodiments, the mean height uniformity of a solder cap may be optimized to improve by over 160% as compared with taller, dimple-less prior art solder cap heights.

Thus, the ability to fabricate fine line/space metal wires of less than about 100 microns, and in some cases comprising a pitch of about 10/10 microns, is enabled. The various embodiments of the present invention allow for the fabrication of metal wires for fine line/space applications, such as in high density 3D package substrates and/or mother board fabrication. The embodiments of the present invention offer many advantages. For example, design of C4 metal stud bumps and step via structures that may be connected to redistribution layer (RDL) or to top metal layer in silicon chips, for fine pitch package interconnections is enabled.

In some embodiments, step via structures are fabricated through a passivation layer between a C4 metal stud bump and a top metal layer or RDL in silicon chips, allowing the formation of round dimpled metal stud bumps. Such round and large dimple C4 metal stud bumps enable the increase of deposition solder volume and its height uniformity on the C4 bump through the utilization of self organization solder capping process, for example. Controlled maximum height of C4 metal stud bumps may be less than about 20 microns, in some embodiments.

Figure 7:
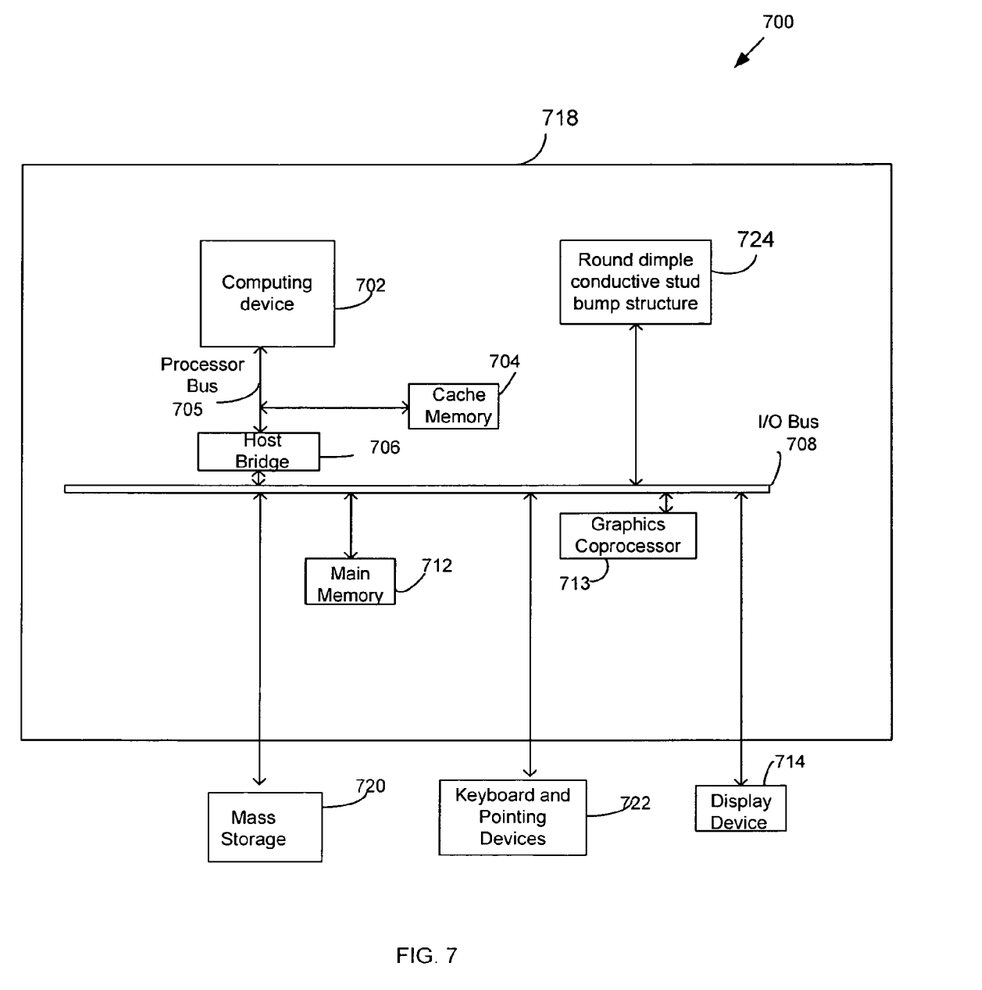
FIG. 7 represents a system according to embodiments of the present invention.

FIG. 7 is a diagram illustrating a system 700 capable of being operated with methods for fabricating a microelectronic structure, such as the round dimple conductive stud bump 118 of FIG. 1e, for example. It will be understood that the present embodiment is but one of many possible systems in which the round dimple conductive stud bump structures of the present invention may be used.

In the system 700, the round dimple conductive stud bump 724 may be communicatively coupled to a printed circuit board (PCB) 718 by way of an I/O bus 708. The communicative coupling of the round dimple conductive stud bump 724 may be established by physical means, such as through the use of a package and/or a socket connection to mount the round dimple conductive stud bump 724 to the PCB 718 (for example by the use of a chip package, interposer and/or a land grid array socket). The round dimple conductive stud bump 724 may also be communicatively coupled to the PCB 718 through various wireless means (for example, without the use of a physical connection to the PCB), as are well known in the art.

The system 700 may include a computing device 702, such as a processor, and a cache memory 704 communicatively coupled to each other through a processor bus 705. The processor bus 705 and the I/O bus 708 may be bridged by a host bridge 706. Communicatively coupled to the I/O bus 708 and also to the round dimple conductive stud bump 724 may be a main memory 712. Examples of the main memory 712 may include, but are not limited to, static random access memory (SRAM) and/or dynamic random access memory (DRAM), and/or some other state preserving mediums. The system 700 may also include a graphics coprocessor 713, however incorporation of the graphics coprocessor 713 into the system 700 is not necessary to the operation of the system 700. Coupled to the I/O bus 708 may also, for example, be a display device 714, a mass storage device 720, and keyboard and pointing devices 722.

These elements perform their conventional functions well known in the art. In particular, mass storage 720 may be used to provide long-term storage for the executable instructions for a method for round dimple conductive stud bump structures in accordance with embodiments of the present invention, whereas main memory 712 may be used to store on a shorter term basis the executable instructions of a method for forming round dimple conductive stud bump structures in accordance with embodiments of the present invention during execution by computing device 702. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 712 may supply the computing device 702 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic packaging structures are well known in the art. Therefore, it is appreciated that the Figures provided herein illustrate only portions of an exemplary microelectronic packaging structure that pertains to the practice of the present invention. Thus the present invention is not limited to the structures described herein.

What is claimed is:

1. A structure comprising:
a passivation layer disposed on a substrate, wherein the passivation layer comprises a step via comprising a second via disposed within a first via; and
a conductive material disposed in the step via, wherein the conductive material comprises a round dimple in a center portion of the conductive material, wherein the conductive material is conductively coupled to at least one of a conductive structure of an array of conductive structures disposed in the substrate, and wherein the round dimple extends over greater than one of the at least one of the conductive structures of the array of conductive structures.

2. The structure of claim 1 wherein the passivation layer comprises a semicured passivation layer.

3. The structure of claim 1 wherein the passivation comprises a semicured passivation layer disposed on a cured passivation layer.

4. The structure of claim 1 further comprising wherein the conductive material comprises a C4 round dimple metal stud bump, and wherein the passivation layer is disposed between the C4 round dimple metal stud bump and a top metal layer.

5. The structure of claim 1 wherein the round dimple extends over the second via.

6. A structure comprising:
a passivation layer comprising a step via comprising a second via disposed within a first via disposed within the passivation layer;
a conductive material disposed in the step via, wherein the conductive material comprises a round dimple bump in a center portion of the conductive material, and wherein the conductive material is conductively coupled to at least one of an array of conductive structures disposed in the substrate; and
a solder cap disposed on the round dimple bump, wherein the round dimple extends across more than one conductive structure.

7. The structure of claim 6 wherein the passivation layer comprises a semicured passivation layer.

8. The structure of claim 6 wherein the passivation comprises a semicured passivation layer disposed on a cured passivation layer.

9. The structure of claim 6 further comprising wherein the conductive material comprises a portion of a C4 round dimple metal stud bump.

10. The structure of claim 9 further comprising a system comprising:
- a bus communicatively coupled to the round dimple metal stud bump; and
- a DRAM communicatively coupled to the bus.

11. The structure of claim 6 further comprising wherein the substrate comprises a portion of a fine pitch package substrate, and wherein the array of conductive structures comprises at least one of a top metal array of conductive structures and a metallic redistribution layer.

12. The structure of claim 6 further comprising wherein the step via comprises a first via width that is greater than a second via width.

13. The structure of claim 6 further comprising wherein the round dimple bump extends over the second via.

14. The structure of claim 6 further comprising wherein a height of the solder cap comprises less than about 20 microns.

* * * * *